US009978744B2

(12) United States Patent
Chang et al.

(10) Patent No.: US 9,978,744 B2
(45) Date of Patent: May 22, 2018

(54) RESISTOR AND METAL-INSULATOR-METAL CAPACITOR STRUCTURE AND METHOD

(71) Applicant: Taiwan Semiconductor Manufacturing Company, Ltd., Hsin-Chu (TW)

(72) Inventors: Chih-Fu Chang, Pingtung County (TW); Jen-Pan Wang, Tainan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 51 days.

(21) Appl. No.: 15/163,914

(22) Filed: May 25, 2016

(65) Prior Publication Data

US 2016/0268253 A1 Sep. 15, 2016

Related U.S. Application Data

(62) Division of application No. 13/797,315, filed on Mar. 12, 2013, now Pat. No. 9,362,269.

(51) Int. Cl.
*H01L 23/522* (2006.01)
*H01L 27/06* (2006.01)
*H01L 49/02* (2006.01)

(52) U.S. Cl.
CPC .......... *H01L 27/0629* (2013.01); *H01L 28/20* (2013.01); *H01L 28/40* (2013.01); *H01L 28/60* (2013.01)

(58) Field of Classification Search
CPC ......... H01L 21/823842; H01L 23/5223; H01L 23/5228; H01L 23/642
See application file for complete search history.

(56) References Cited

U.S. PATENT DOCUMENTS

| 5,872,018 | A | 2/1999 | Lee | |
|---|---|---|---|---|
| 2005/0035417 | A1* | 2/2005 | Visokay | H01L 21/28088 257/407 |
| 2005/0042818 | A1* | 2/2005 | Randazzo | H01L 21/76807 438/238 |
| 2005/0128832 | A1 | 6/2005 | Coutu | |
| 2007/0267705 | A1 | 11/2007 | Won | |
| 2011/0115005 | A1 | 5/2011 | Coolbaugh | |

\* cited by examiner

*Primary Examiner* — Thomas L Dickey
(74) *Attorney, Agent, or Firm* — Haynes and Boone, LLP

(57) ABSTRACT

A passive device and method of fabricating the passive device are disclosed herein. The capacitor structure incorporates a resistor and a capacitor. An exemplary method includes receiving a substrate that has undergone front end of line (FEOL) processing, and performing back end of line (BEOL) processing on the substrate, wherein a capacitor structure is formed over the substrate during the BEOL processing, the capacitor structure incorporating a resistor with a capacitor. The BEOL processing can include performing a first metallization process to form a bottom plate of the capacitor structure; forming a dielectric spacer of the capacitor structure over the bottom plate; forming a top plate of the capacitor structure over the dielectric spacer; and performing a second metallization process to form contacts coupled to the top plate and the bottom plate of the capacitor structure.

20 Claims, 11 Drawing Sheets

RESISTOR AND METAL-INSULATOR-METAL CAPACITOR STRUCTURE AND METHOD

PRIORITY DATA

The present application is a divisional application of U.S. patent application Ser. No. 13/797,315, filed Mar. 12, 2013, which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

As merely one example, metal device gates are incompatible with some conventional methods of forming passive devices (e.g., resistors, inductors, and capacitors). Many techniques for forming metal device gates include forming a polysilicon dummy gate early in the fabrication process. The polysilicon retains the gate shape during processing steps, such as annealing, that a metal gate might not survive. Eventually the dummy gate is etched away and the metal gate is formed. This is a concern for forming passive devices because some passive devices, particularly resistors, are conventionally formed using ion-implanted polysilicon. The etching to remove the dummy gate may not distinguish between the gate polysilicon and the polysilicon of the passive device. For this reason and others, although existing passive device structures and fabrication methods have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
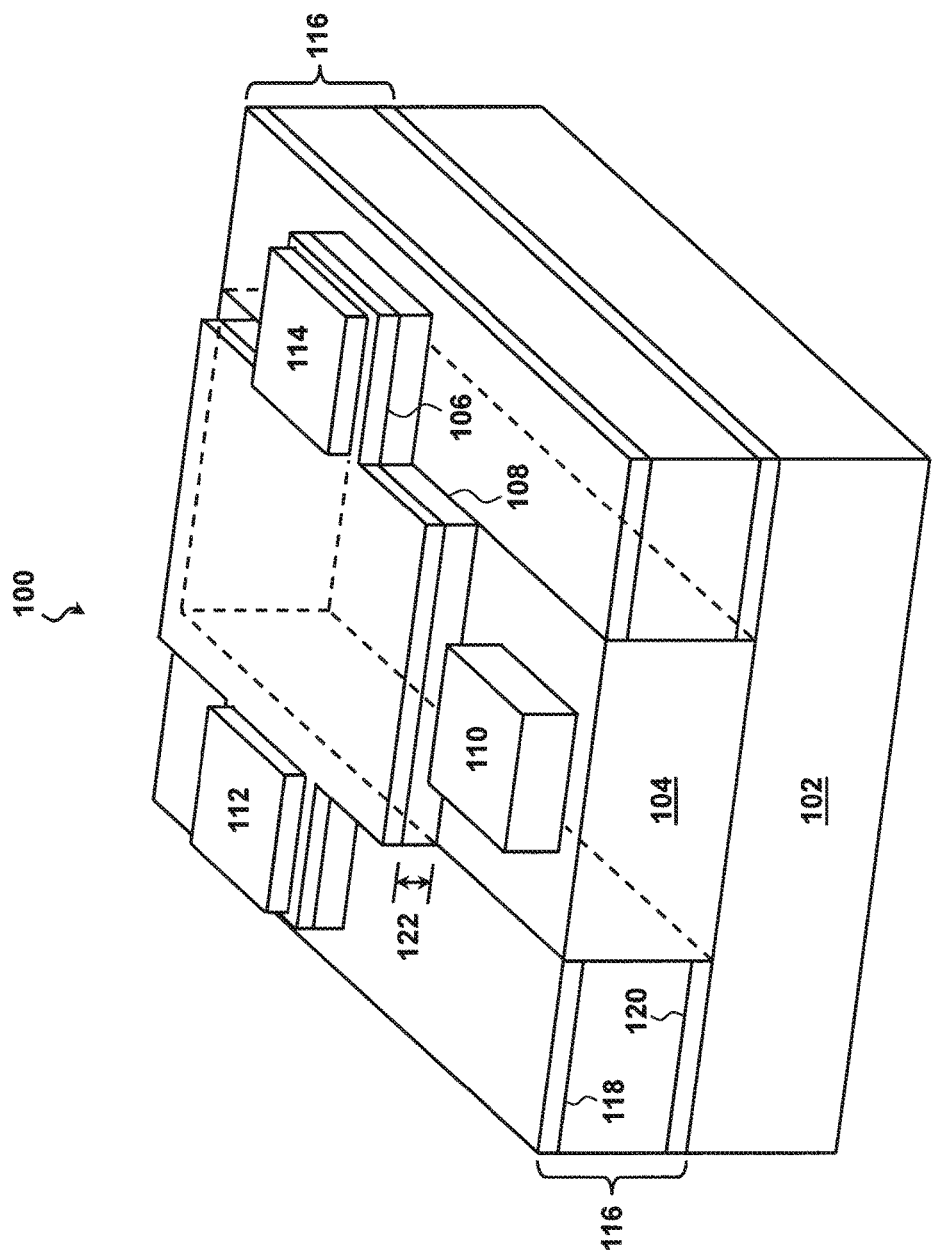
FIG. 1A is a perspective view of a passive integrated circuit device according to various aspects of the present disclosure.

The present disclosure relates generally to IC device manufacturing and more particularly, to a passive integrated circuit device incorporating both a resistor and a capacitor and to a method of forming the circuit device.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1A is a perspective view of a passive integrated circuit device 100 according to various aspects of the present disclosure. FIG. 1A has been simplified for the sake of clarity to better illustrate the inventive concepts of the present disclosure. Additional features may be incorporated into the integrated circuit device 100, and some of the features described below may be replaced or eliminated for other embodiments of the integrated circuit device 100.

The integrated circuit device 100 includes a substrate 102, a bottom plate 104 disposed above the substrate 102, a top plate 106 disposed above the bottom plate 104, and a dielectric spacer 108 disposed between the bottom plate 104 and the top plate 106. This structure forms a capacitor between the bottom plate 104 and the top plate 106. To connect the capacitor to a circuit, a bottom-plate contact 110 is electrically coupled to the bottom plate 104 and a first contact 112 and a second contact 114 are each electrically coupled to the top plate 106. It is understood that while the contacts 110, 112, and 114 are illustrated as monolithic contacts, in various embodiments, the contacts 110, 112, and 114 are contact groups of redundant contacts. The top plate 106 may also serve as a resistor, and in some embodiments, is configured to provide a predetermined target resistance between the first contact 112 and the second contact 114. The resulting three-terminal device 100 can be used as a capacitor, a resistor, or both concurrently as required by the application. As disclosed in more detail below, the concept can be extended to five-terminal devices and beyond.

This configuration provides several advantages. While conventional polysilicon passive devices are widely used, the processes of forming metal device gates, particularly the etch processes for removing a polysilicon dummy gate that precedes forming a metal gate, may damage a polysilicon passive device. To overcome this, in some embodiments, the integrated circuit device 100 is formed after the metal gate is fabricated. In the embodiment of FIG. 1A, the bottom plate 104, the dielectric spacer 108, and the top plate 106 are each formed above the substrate 102. As a result, in some such embodiments, these structures are formed as part of a back end of line (BEOL) process. In contrast, forming a gate electrode is typically a front end of line (FEOL) process. In such embodiments, the BEOL circuit device 100 is only formed after the potentially damaging FEOL processes have completed. This prevents damage that might occur, for example, while removing a polysilicon dummy gate. As a further advantage, in some embodiments, it is less costly and time-consuming to redesign or adjust BEOL structures as fewer masks are affected. In some embodiments, the bottom plate 104 includes a ceramic material instead of a polysilicon material. In such embodiments, the ceramic material may resist fabrication processes that would damage a polysilicon structure. These advantages are merely exemplary, and one of skill in the art will recognize further advantages of the integrated circuit device. No particular advantage is necessary or required for any particular embodiment.

The structure of the integrated circuit device 100 will now be disclosed in more detail. As disclosed above, the integrated circuit device 100 is formed on a substrate 102. In some embodiments, the substrate 102 includes an elementary semiconductor (e.g., silicon or germanium) and/or a compound semiconductor (e.g., silicon germanium, silicon carbide, gallium arsenide, indium arsenide, gallium nitride, and indium phosphide). Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride (CaF$_2$), and/or other suitable materials. In some embodiments, the substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. For example, a region of the substrate 102 may be doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques.

In many embodiments, the substrate 102 includes one or more active devices (not shown) formed on the substrate. Examples of such active devices include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, other suitable devices, and/or combinations thereof.

The circuit device 100 includes one or more interlayer (or inter-level) dielectric layers (ILDs) 116, of which one is shown, formed over the substrate 102. Each ILD 116 may include a semiconductor oxide, a semiconductor nitride, a semiconductor oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, and/or combinations thereof. In some embodiments, the ILD 116 includes one or more sub-layers such as an etch stop layer 118 and/or a contact etch stop layer (CESL) 120. Etch stop layers typically exhibit different etchant sensitivity from the remainder of the ILD 116. For example, silicon oxide is more sensitive to buffered hydrofluoric acid than silicon nitride, whereas silicon nitride is more sensitive to phosphoric acid than silicon oxide. Accordingly, an ILD 116 that is predominantly silicon oxide may include a silicon nitride etch stop layer 118.

The bottom plate 104 is formed over the substrate 102 and includes a conductive material, such as tungsten, although any suitable conductive material may be used. In further embodiments, the bottom plate 104 includes copper, aluminum, aluminum/silicon/copper alloy, titanium, titanium nitride, tungsten nitride, metal silicide, and/or combinations thereof. As illustrated in FIG. 1A and disclosed in more detail below, the bottom plate 104 extends underneath the top plate 106. Thus, the capacitance of the circuit device 100 can be tuned by adjusting the size of the portion of the bottom plate 104 directly underlying the top plate 106. A bottom-plate contact 110 is formed over the bottom plate 104 and is electrically coupled to the bottom plate 104. The bottom-plate contact 110 includes a conductive material, such as copper, aluminum, aluminum/silicon/copper alloy, titanium, titanium nitride, tungsten, metal silicide, and/or combinations thereof.

A dielectric spacer 108 is formed above the bottom plate 104. The dielectric spacer 108 inhibits current flow between the bottom plate 104 and the top plate 106. Accordingly, the dielectric spacer 108 includes one or more suitable materials that render the spacer 108 electrically insulating. In various embodiments, the dielectric spacer 108 includes a conventional dielectric material (e.g., a semiconductor oxide, a semiconductor nitride, a semiconductor oxynitride, carbon doped silicon oxide, etc.), a high-k dielectric material (e.g., HfO$_2$, HfSiO, HfSiON, HfTaO, HfTiO, HfZrO, etc.), other suitable dielectric material, and/or combinations thereof. In further embodiments, the dielectric spacer 108 includes one or more of TEOS oxide, PSG, BPSG, FSG, Black Diamond®, Xerogel, Aerogel, amorphous fluorinated carbon, Parylene, BCB, SILK, polyimide, other suitable materials, and/or combinations thereof. The dielectric spacer 108 may be formed to any thickness 122, and, in that regard, the thickness 122 and materials of the dielectric spacer 108 may be configured to tune the capacitance of the circuit device 100 as disclosed below.

The top plate 106 is formed above the dielectric spacer 108. In some embodiments, the top plate 106 includes a ceramic material such as titanium nitride or tantalum nitride. In further embodiments, the top plate 106 includes ion-implanted polysilicon. In such embodiments, the top plate 106 is fabricated after a polysilicon dummy gate is removed to avoid damaging the top plate 106. As the top plate 106 forms a resistor between the first contact 112 and the second contact 114, the materials and dimensions of the top plate 106 may be configured to achieve a predetermined target resistance. For example, resistance can be determined by:

$$R = \rho \frac{\ell}{A},$$

where R is the total resistance, ρ is the electrical resistivity of the material of the top plate 106, l is the distance between the first contact 112 and the second contact 114, and A is the cross sectional area of the top plate 106 between the first contact 112 and the second contact 114.

As disclosed above, the top plate 106 also forms a capacitor in conjunction with the bottom plate 104, and the materials and dimensions of the top plate 106 may also be configured to achieve a target capacitance. Capacitance can be determined by:

$$C = \frac{k \varepsilon_0 A}{d},$$

where C is the total capacitance, k is the relative permittivity of the dielectric spacer 108, $\varepsilon_0$ is the permittivity of space (8.854×10$^{-12}$ F/m), A is the surface area of the portion of the top plate 106 disposed directly above the bottom plate 104, and d is the thickness 122 of the dielectric spacer 108. Accordingly, the circuit device 100 can be produced with any desired combination of resistance and capacitance by modifying one or more of the bottom plate 104, the dielectric spacer 108, and/or the top plate 106. Furthermore, in some embodiments, any of these adjustments can be made as BEOL changes.

Figure 1C:
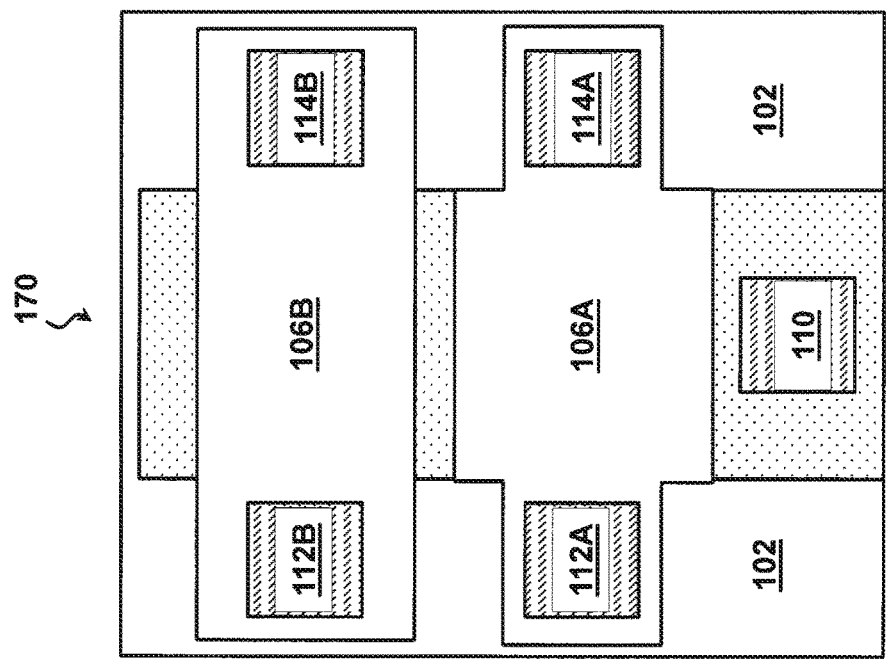
FIGS. 1B and 1C are top views of passive integrated circuit devices according to various aspects of the present disclosure.
Figure 1B:
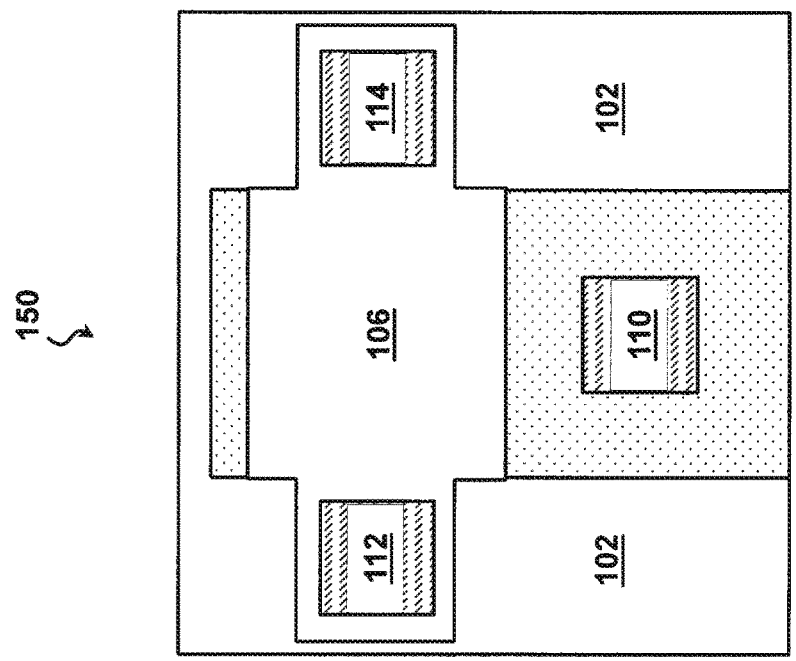

FIG. 1B is a top view of a passive integrated circuit device 150 according to various aspects of the present disclosure. The integrated circuit device 150 may be substantially similar to circuit device 100 of FIG. 1A. In that regard, the integrated circuit device includes a substrate 102, a bottom plate 104, a bottom-plate contact 110, a dielectric spacer (not illustrated), a top plate 106, a first top-plate contact 112, a second top-plate contact 114 each substantially similar to the respective element of FIG. 1A. The integrated circuit device 150 provides a three-terminal passive device with configurable resistance and capacitance. In some embodiments, the integrated circuit device 150 is formed entirely via BEOL processes.

FIG. 1C is a top view of a passive integrated circuit device 170 according to various aspects of the present disclosure. Device 170 illustrates an embodiment that expands the present concepts beyond a three terminal-device to further combinations of resistive and capacitive elements. The integrated circuit device 170 may be substantially similar to circuit device 100 of FIG. 1A. In that regard, the integrated circuit device includes a substrate 102, a bottom plate 104, and a bottom-plate contact 110 each substantially similar to the respective element of FIG. 1A. Device 170 further includes a pair of top plates, top plate 106A and top plate 106B spaced apart from the bottom plate 104 by a pair of dielectric spacers (not illustrated). Each top plate includes a pair of electrically coupled top-plate contacts (e.g., first top-plate contact 112A and second top-plate contact 114A electrically coupled to top plate 106A, and first top-plate contact 112B and second top-plate contact 114B electrically coupled to top plate 106B). Each of top plates 106A and 106B may be configured to achieve a target resistance, and in some embodiments, the respective target resistances are different. In one such embodiment, top plate 106A is configured to provide a first target resistance, and top plate 106b is configured to provide a second target resistance. Configuring the top plates 106A and 106B to achieve the respective target resistances may include forming the plates with different physical structures. In various embodiments, the distance between electrodes, the cross-sectional area of the top plate and/or other physical characteristics vary between plates 106A and 106B.

The top plates 106A and 106B and the bottom plate 104 may be further configured to achieve a target capacitance. The target capacitance may be measured between any combination of terminals/contacts. That is, in some embodiments, the device 170 is configured to provide a target capacitance measured between the bottom plate 104 and top plate 106A. In some embodiments, the device 170 is configured to provide a target capacitance measured between the bottom plate 104 and top plate 106B. In some embodiments, the device 170 is configured to provide a target capacitance measured between the bottom plate 104 and the combined top plate 106A and top plate 106B. From FIG. 1C and the remainder of the disclosure, one of skill in the art will recognize that the concepts of the present disclosure may be extended to embodiments incorporating any number of top plates and corresponding top-plate contacts.

Figure 2:
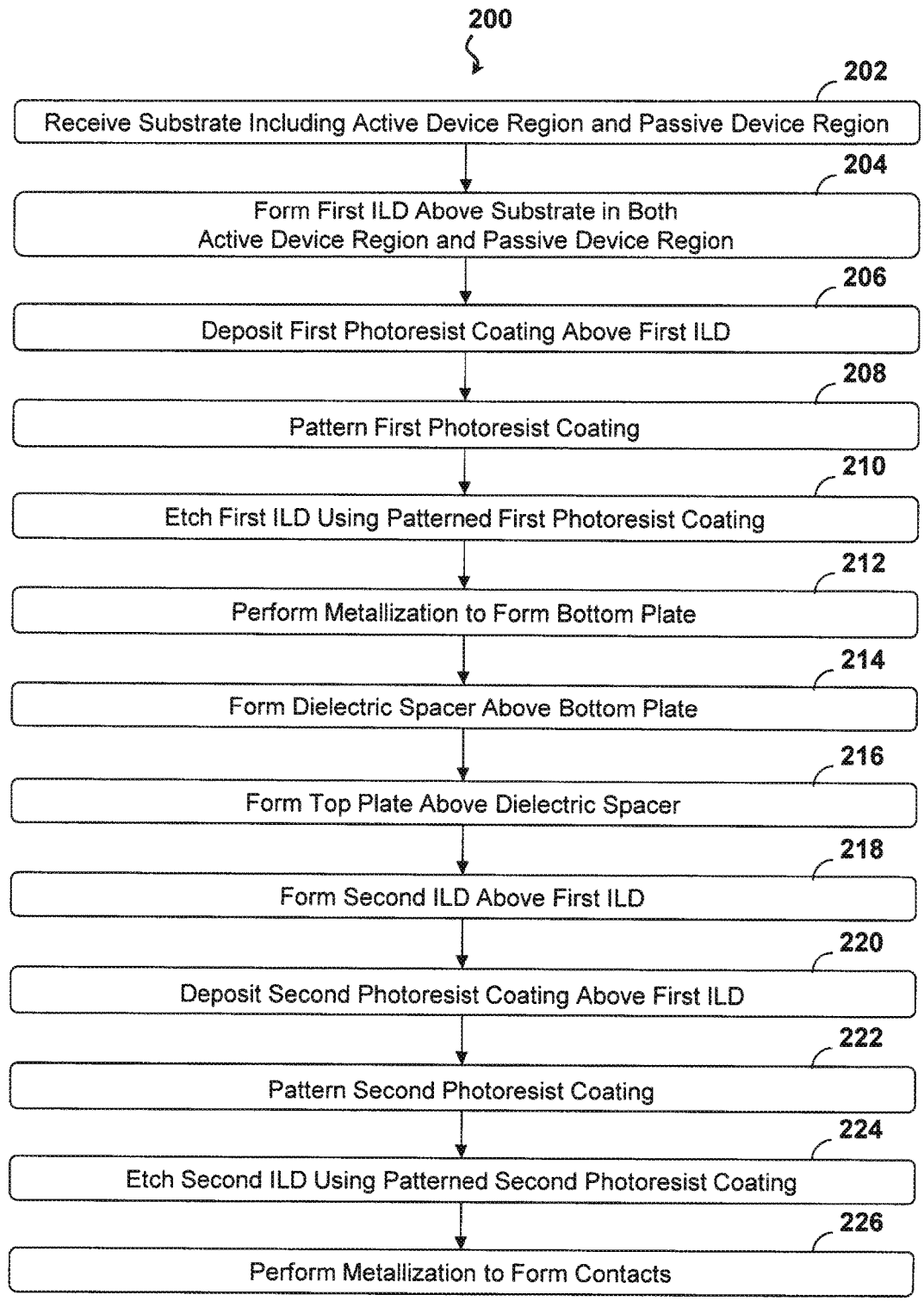
FIG. 2 is a flow diagram of a method for forming a passive circuit element according to various aspects of the present disclosure.

A method 200 for forming a combined resistor and metal-in-metal capacitor device is disclosed with reference to FIG. 2 and FIGS. 3-17. FIG. 2 is a flow diagram of the method 200 for forming a passive circuit element according to various aspects of the present disclosure. It is understood that additional steps can be provided before, during, and after the method 200 and that some of the steps described can be replaced or eliminated for other embodiments of the method 200. FIGS. 3-17 are cross-sectional views of an integrated circuit 300 undergoing the method 200 for forming a combined resistor and metal-in-metal capacitor device according to various aspects of the present disclosure. FIGS. 3-17 have been simplified for the sake of clarity and to better illustrate the inventive concepts of the present disclosure.

Figure 3:
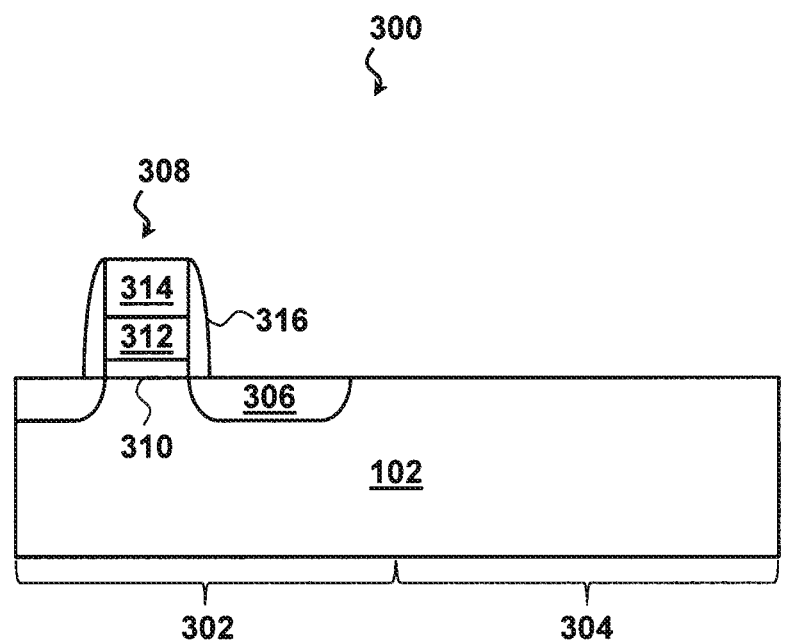
FIGS. 3-17 are cross-sectional views of an integrated circuit undergoing a method for forming a combined resistor and metal-in-metal capacitor device according to various aspects of the present disclosure.

Referring to block 202 of FIG. 2 and to FIG. 3, a substrate 102 is received. The substrate 102 may be substantially similar to the substrate 102 disclosed with respect to FIGS. 1A, 1B, and 1C and includes an active device region 302 and a passive device region 304. An active device such as a PFET, an NFET, a MOSFET, a CMOS transistor, a FinFET, a high voltage transistor, a high frequency transistor, a bipolar junction transistor, and/or other suitable device is formed in the active device region 302. In an exemplary embodiment, the active device includes source/drain regions 306 and a gate stack 308. The source/drain regions 306 may be formed by implanting the substrate 102 with p-type dopants (P+), such as boron or BF$_2$, and/or n-type dopants (N+), such as phosphorus or arsenic. In some embodiments, the source/drain regions 306 are formed by processes including halo implantation, etching, ion-implantation, epitaxy, and/or annealing steps.

With respect to the gate stack 308, an exemplary gate stack 308 comprises an interfacial layer 310, a gate dielectric layer 312, and a gate electrode layer 314. The interfacial layer 310 may include silicon oxide, silicon nitride, silicon oxynitride, other semiconductor oxides, other suitable interfacial materials, and/or combinations thereof and may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes.

The gate dielectric layer 312 may include a high-k dielectric material such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric layer 312 may include other dielectrics such as a silicon oxide, silicon nitride, silicon oxynitride, silicon carbide, amorphous carbon, tetraethylorthosilicate (TEOS), other suitable dielectric material, and/or combinations thereof. The gate dielectric layer 312 may be formed to any suitable thickness using any suitable process including ALD, CVD, HDP-CVD, PVD, spin-on deposition, and/or other suitable deposition processes.

The gate electrode layer 314 may include any suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 314 includes a matched work function metal. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. In some embodiments, the gate electrode layer 314 includes multiple layers of varying composition. While some of the advantages of the present disclosure are particular to metal gate electrode embodiments, one of skill in the art will recognize that the concepts of the present disclosure apply equally to polysilicon gate electrode embodiments. Accordingly, in some embodiments, gate electrode layer 314 is a polysilicon gate electrode layer. The gate stack 308 may also include sidewall spacers 316 formed on one or more lateral surfaces of the gate stack 308. It is understood that some of the elements of the active device may be formed by conventional processing, and thus some processes are not described in detail herein.

In many embodiments, the processes used to form the active device, including ion implantation and the forming of the gate stack 308, are referred to as front end of line (FEOL) processes. In contrast, subsequent processes, including those involved in forming interconnects, are referred to as back end of line (BEOL) processes. BEOL processes take place after the FEOL processes complete. Accordingly, in some embodiments, the processes of blocks 204-226 are all BEOL processes. Forming passive devices in BEOL means that the passive devices are not present for FEOL processing and are not affected by FEOL steps that may adversely impact passive device performance. As another advantage, in some such embodiments, BEOL passive devices are less costly to fine tune, as changes to BEOL steps require fewer mask changes.

Figure 4:
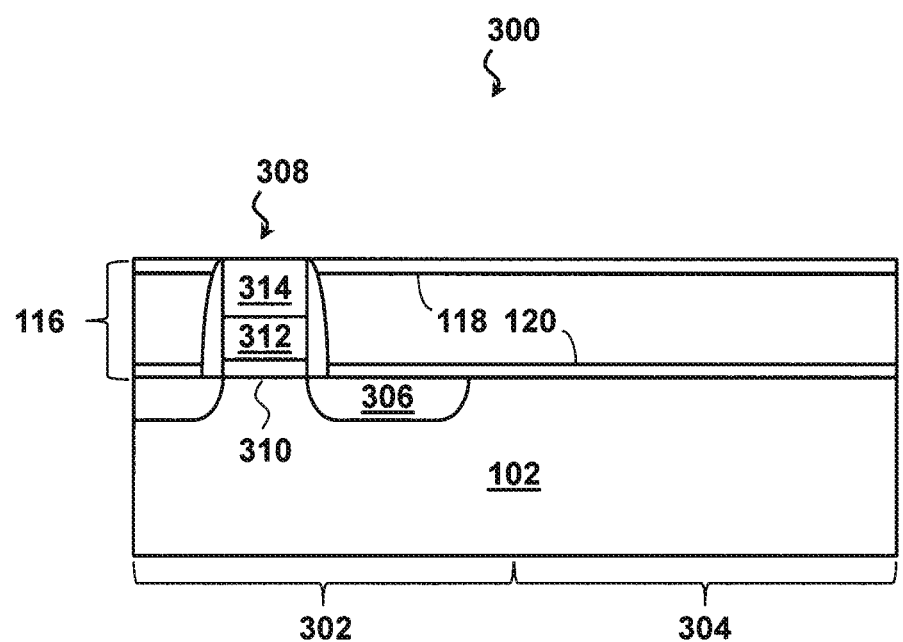

Referring now to block 204 of FIG. 2 and to FIG. 4, a first ILD 116 is formed above the substrate 102 in both the active device region 302 and the passive device region 304. The first ILD 116 may be substantially similar to the ILD 116 of FIG. 1A. In that regard, the ILD 116 may include any suitable dielectric including a semiconductor oxide, a semiconductor nitride, a semiconductor oxynitride, TEOS oxide, PSG, BPSG, FSG, carbon doped silicon oxide, Black Diamond®, xerogel, aerogel, amorphous fluorinated carbon, Parylene, BCB, SILK, polyimide, other suitable materials, and/or combinations thereof. The first ILD 116 may be formed to any suitable thickness using any suitable process including ALD, CVD, HDP-CVD, PVD, spin-on deposition, and/or other suitable deposition processes. In some embodiments, forming the first ILD 116 includes polishing the deposited ILD material via a process such as a chemical mechanical polishing (CMP). The first ILD 116 may include layers such as an etch stop layer 118 and/or a contact etch stop layer (CESL) 120. For example, in the illustrated embodiment, the first ILD 116 includes etch stop layers 118 and 120 substantially similar to etch stop layers 118 and 120 of FIG. 1A. Forming a first ILD 116 that includes multiple layers may entail iterations of deposition and polishing.

Figure 5:
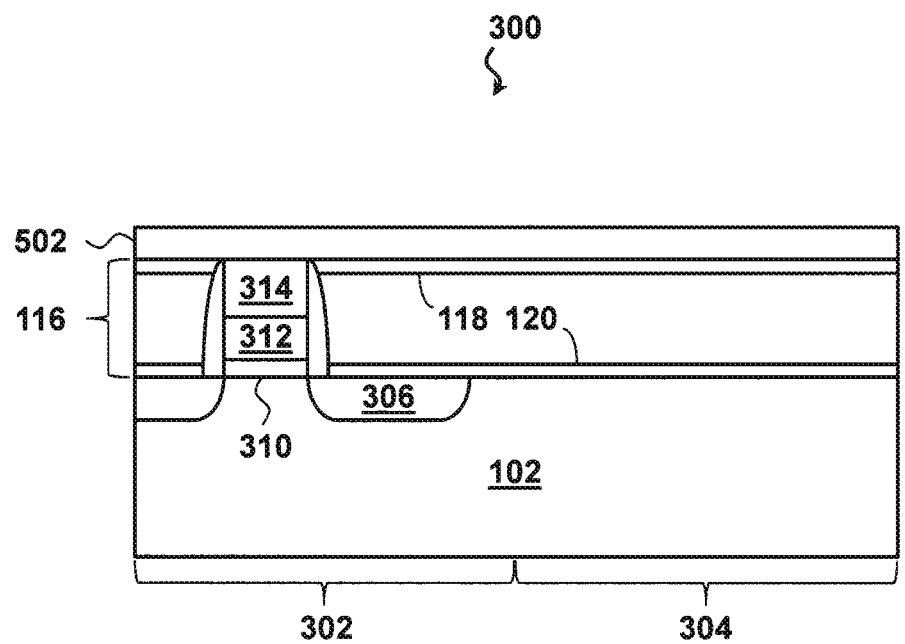
Figure 6:
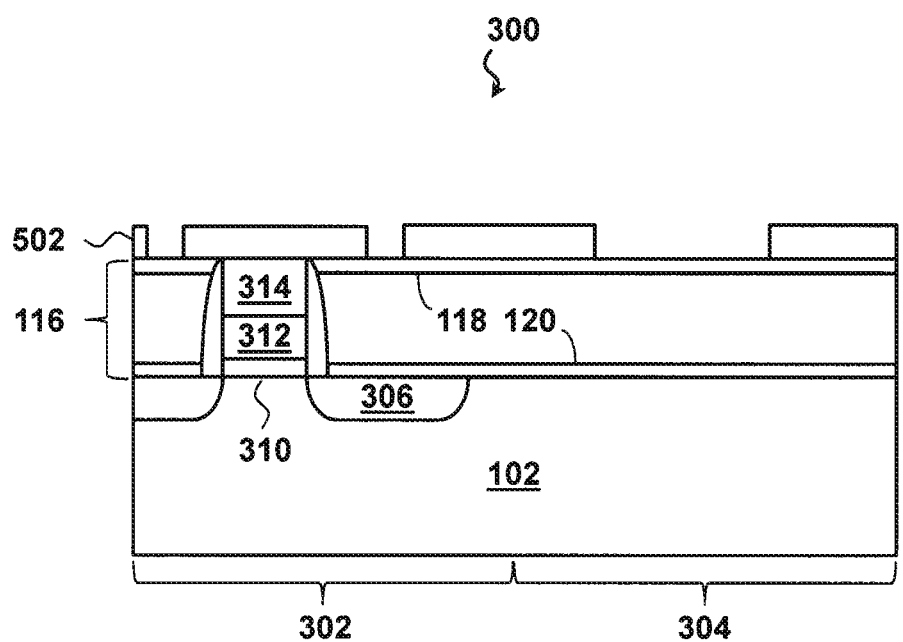

Referring to block 206 of FIG. 2 and to FIG. 5, a first photoresist coating 502 is formed above the first ILD 116 in both the active device region 302 and the passive device region 304. Referring to block 208 of FIG. 2 and to FIG. 6, the first photoresist coating 502 is patterned to define a bottom plate within the passive device region 304 and may be patterned to define source/drain region contacts within the active device region 302. The patterning of block 208 may include soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing. As the patterning of the first photoresist coating 502 defines the bottom plate, in some embodiments, the pattern of the first photoresist coating 502 depends on the target capacitance.

Figure 7:
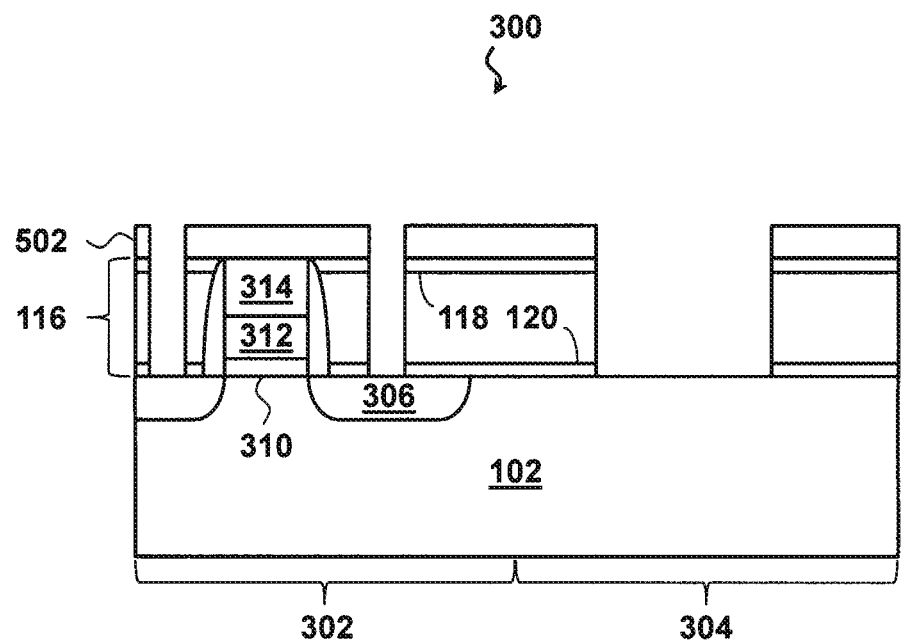

Referring to block 210 of FIG. 2 and to FIG. 7, the first ILD 116 is etched to expose the source/drain regions 306 within the active device region 302 and a region corresponding to a bottom plate within the passive device region 304. The etching transfers the pattern of the first photoresist coating 502 and may further define the bottom plate. Etching the first ILD 116 may include multiple etching steps, particularly in embodiments in which the first ILD 116 contains multiple layers. For example, in an embodiment, the etching of the first ILD 116 includes a contact etching process where the etching chemistry, flow rate, temperature, and/or etching environment is carefully selected to avoid etching the underlying substrate 102. This may be facilitated by a contact etch stop layer (CESL) 120 of the first ILD 116 formed adjacent to the substrate. The first photoresist coating 502 may be stripped following the etching of block 210.

In some embodiments, a self-aligned silicide (not shown) is formed in at least the active device region 302 to reduce resistance at the interface between the substrate 102 (e.g., a source/drain region 306 of the substrate 102) and the eventual contact. In an exemplary embodiment, a layer of tungsten is deposited by CVD within a void created by the etching of block 210 and in contact with the substrate 102. An annealing process is performed to facilitate a reaction between the tungsten and the substrate 102 to form a silicide. Remaining unreacted tungsten may be removed via chemical etching.

Figure 8:
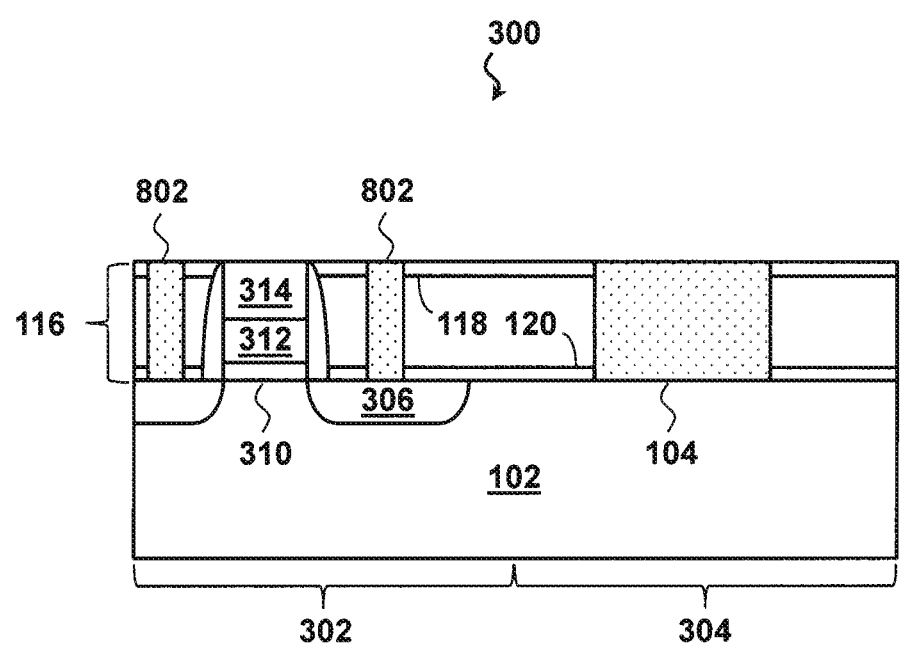

Referring to block 212 of FIG. 2 and to FIG. 8, a metallization process is performed on the substrate 102. The metallization process forms a bottom plate 104 within the first ILD 116, which may be substantially similar to the bottom plate 104 disclosed with reference to FIGS. 1A, 1B, and 1C. In that regard, the bottom plate 104 may be configured to provide a target capacitance. The metallization process may also form source/drain contacts 802 electrically coupled to the source/drain regions 306. Metallization refers to the deposition of any suitable conductive material, whether the material is technically a metal or not. In an exemplary embodiment, the metallization process deposits tungsten via a CVD process. In further embodiments, the process deposits copper, aluminum, aluminum/silicon/copper alloy, titanium, titanium nitride, tungsten nitride, metal silicide, non-metallic conductive material, and/or combinations thereof. The metallization of block 212 may also include a chemical mechanical polish (CMP) process.

Referring to block 214 of FIG. 2, a dielectric spacer 108 is formed within the passive device region 304 and above the bottom plate 104. Referring to block 216 of FIG. 2, a top plate 106 is formed above the dielectric spacer 108. The dielectric spacer 108 and top plate 106 may each be formed by any suitable process and may be formed independently or concurrently. An exemplary process for forming a dielectric spacer 108 and top plate 106 is disclosed with reference to FIGS. 9-12. One of skill in the art will recognize that the principles of the present disclosure apply equally to other deposition and formation processes.

Figure 9:
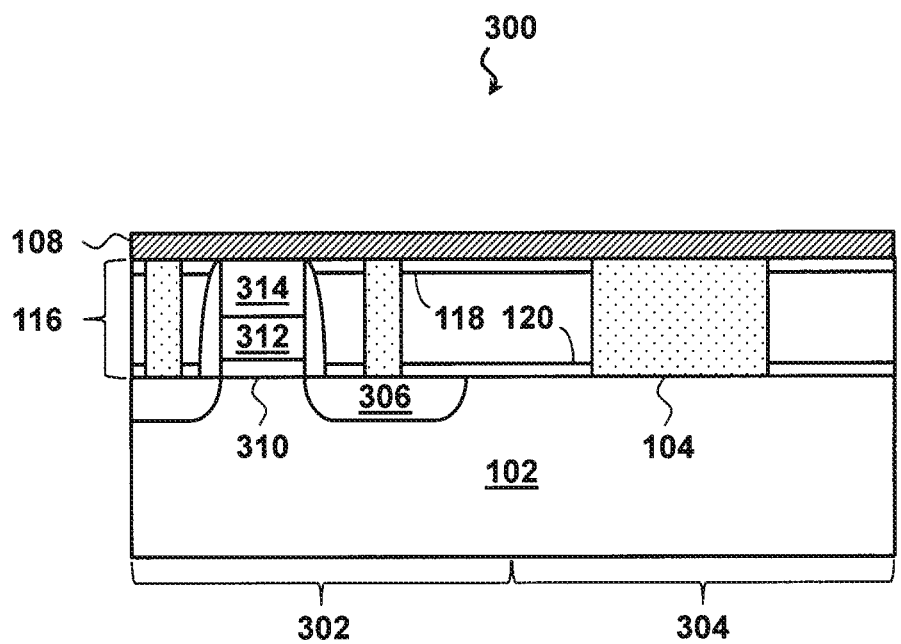

Referring first to FIG. 9, in an embodiment a dielectric spacer 108 material is deposited over the passive device region 304 of the substrate 102 and may be deposited over the active device region 302. The dielectric spacer 108 may be substantially similar to the spacer 108 disclosed with respect to FIG. 1A. Accordingly, as the dielectric spacer 108 is incorporated into a capacitive structure, elements of the dielectric spacer 108 material including thickness and constituent materials may be configured to produce a target capacitance. In various embodiments, the dielectric spacer 108 includes a conventional dielectric material (e.g., a semiconductor oxide, a semiconductor nitride, a semiconductor oxynitride, carbon doped silicon oxide, etc.), a high-k dielectric material (e.g., $HfO_2$, HfSiO, HfSiON, HfTaO, HfTiO, HfZrO, etc.), other suitable dielectric material, and/or combinations thereof. In further embodiments, the dielectric spacer 108 includes one or more of TEOS oxide, PSG, BPSG, FSG, Black Diamond®, Xerogel, Aerogel, amorphous fluorinated carbon, Parylene, BCB, SILK, polyimide, other suitable materials, and/or combinations thereof. The dielectric spacer 108 material may be deposited using a suitable process such as ALD, CVD, HDP-CVD, PVD, spin-on deposition, and/or other suitable deposition process. In some embodiments, depositing the dielectric spacer 108 material includes polishing the deposited material via a process such as a chemical mechanical polishing (CMP).

Figure 10:
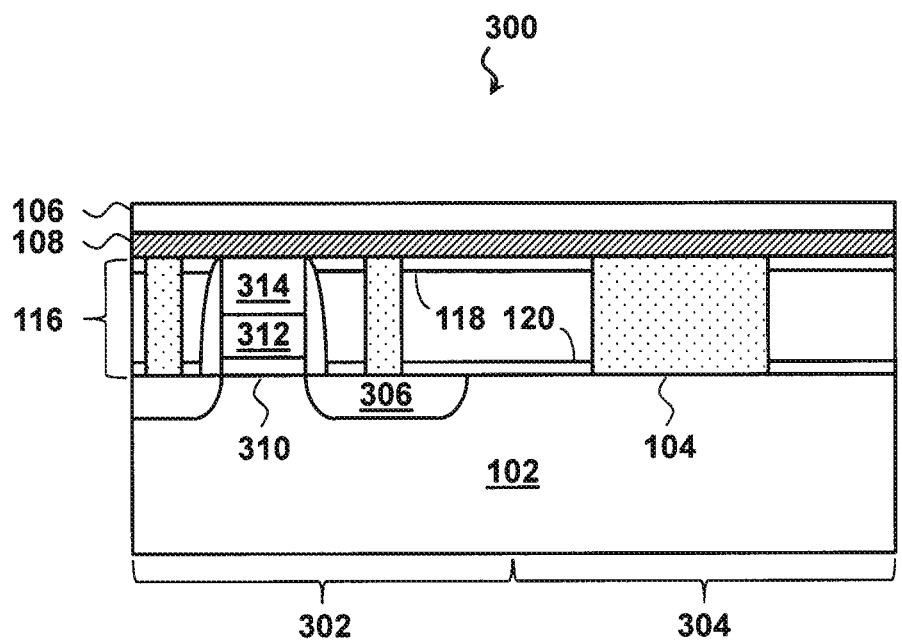

Referring to FIG. 10, a top plate 106 material is deposited above the dielectric spacer 108 in at least the passive device region 304 of the substrate 102. In some embodiments, the top plate 106 material is further deposited above the active device region 302 of the substrate 102. The top plate 106 may be substantially similar to the top plate 106 disclosed with respect to FIGS. 1A, 1B, and 1C. Accordingly, as the top plate 106 provides a target resistance, elements of the top plate 106 material including thickness and constituent materials may be configured to produce the target resistance. The top plate 106 is also incorporated into a capacitive structure, and thus elements of the top plate 106 material may be configured to produce a target capacitance. In some embodiments, the top plate 106 material includes a ceramic material such as titanium nitride or tantalum nitride. Additionally, or in the alternative, the top plate 106 material includes polysilicon. As the top plate 106 material may be deposited in a BEOL process, it overcomes some of the disadvantages of a conventional polysilicon device. In some embodiments, depositing the top plate 106 material includes polishing the deposited material via a process such as a chemical mechanical polishing (CMP).

Figure 11:
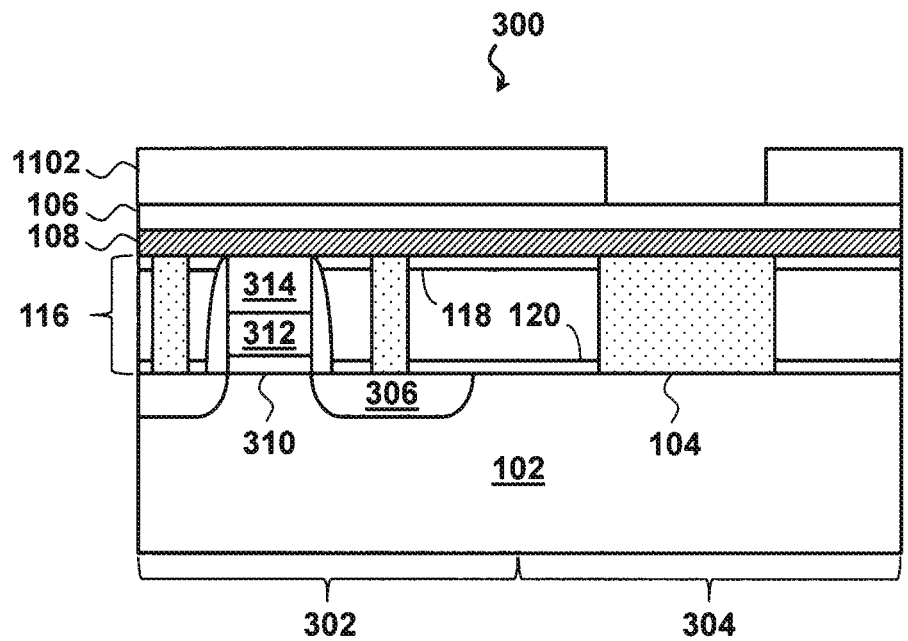
Figure 12:
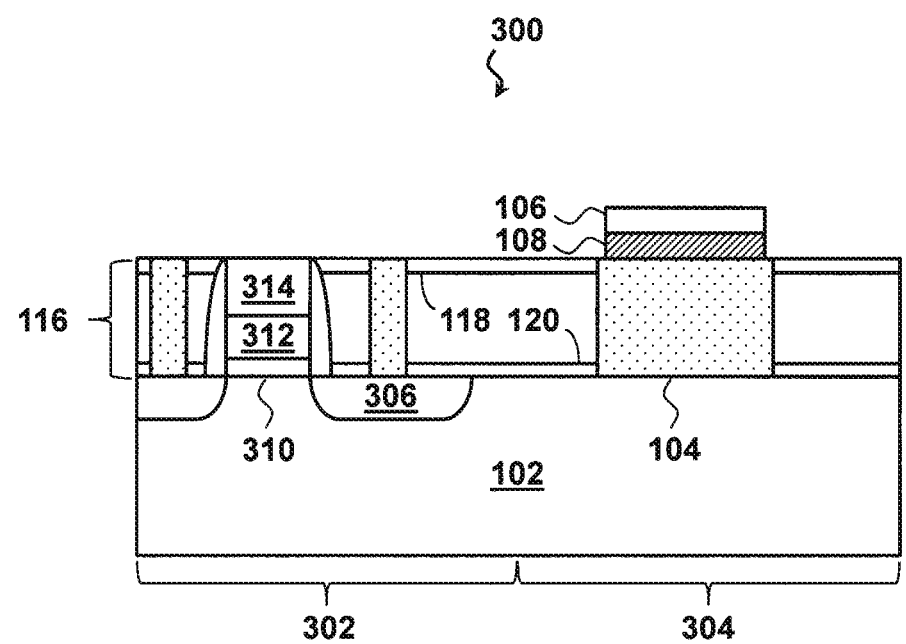

Referring to FIG. 11, a photoresist coating 1102 is formed over the dielectric spacer 108 material and the top plate 106 material. The photoresist coating 1102 is patterned to define the dielectric spacer 108 and the top plate 106. Patterning may include soft baking, mask aligning, exposure, post-exposure baking, developing the photoresist, rinsing, and drying (e.g., hard baking). Referring to FIG. 12, the dielectric spacer 108 material and the top plate 106 material are etched using the patterned photoresist coating 1102 to form the dielectric spacer 108 and the top plate 106 respectively. As the top plate 106 provides a target resistance and a target capacitance, elements of the top plate 106 including length and cross-sectional area may be configured to produce the target resistance and capacitance. As the dielectric spacer 108 provides a target capacitance, elements of the dielectric spacer 108 including the surface area may be configured to produce the target capacitance. Various edges of the dielectric spacer 108 and/or the top plate 106 may be aligned with the bottom plate 104 and/or extend beyond the bottom plate 104 as illustrated in FIGS. 1A, 1B, and 1C and may leave portions of the bottom plate 104 uncovered as illustrated in FIG. 10. The photoresist coating 1102 may be removed after etching the top plate 106 and/or the dielectric spacer 108.

Figure 13:
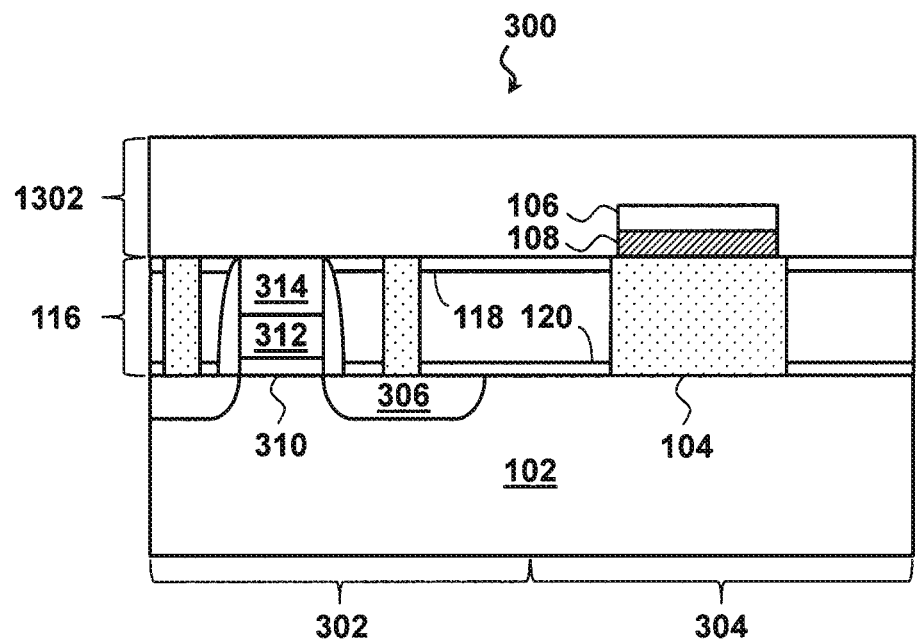

Referring to block 218 of FIG. 2 and to FIG. 13, a second ILD 1302 is formed within the active device region 302 and the passive device region 304 and above the first ILD 116. The second ILD 1302 may be substantially similar in composition to ILD 116 of FIGS. 1A, 1B, and 1C. In that regard, the second ILD 1302 may include a semiconductor oxide, a semiconductor nitride, a semiconductor oxynitride, TEOS oxide, PSG, BPSG, FSG, carbon doped silicon oxide, Black Diamond®, Xerogel, Aerogel, amorphous fluorinated carbon, Parylene, BCB, SILK, polyimide, other suitable materials, and/or combinations thereof. In some embodiments, the second ILD 1302 includes one or more sub-layers such as etch stop layers. The second ILD 1302 may be formed to any suitable thickness using any suitable process including ALD, CVD, HDP-CVD, PVD, spin-on deposition, and/or other suitable deposition processes. In some embodiments, forming the second ILD 1302 includes polishing the deposited ILD material via a process such as a chemical mechanical polishing (CMP).

Figure 14:
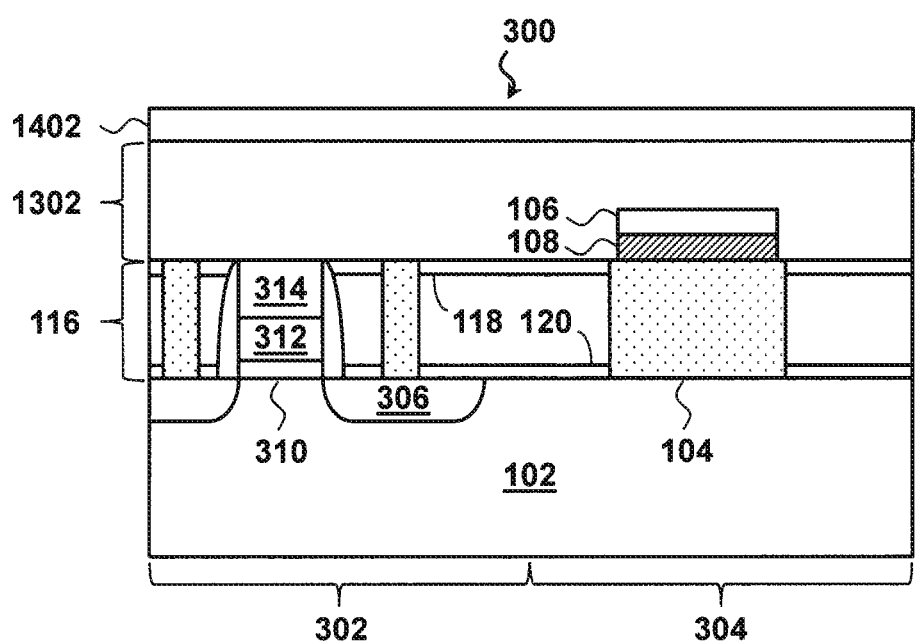
Figure 15:
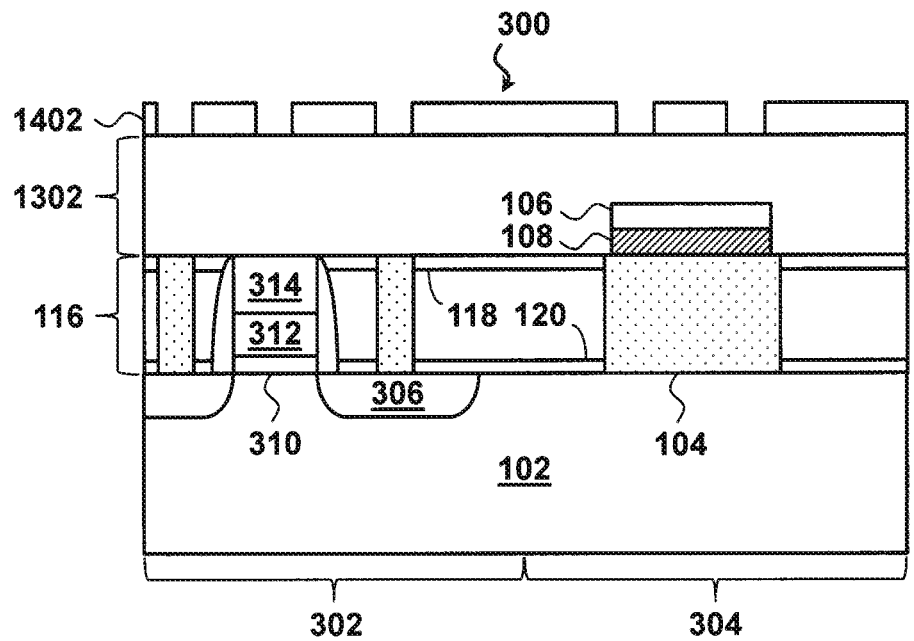

Referring to block 220 of FIG. 2 and to FIG. 14, a second photoresist coating 1402 is formed above the second ILD 1302 in both the active device region 302 and the passive device region 304. Referring to block 222 of FIG. 2 and to FIG. 15, the second photoresist coating 1402 is patterned to define a first contact and a second contact, which will eventually be electrically coupled to the top plate 106 and is further patterned to define a bottom-plate contact, which will eventually be electrically coupled to the bottom plate 104. Within the active device region 302, the second photoresist coating 1402 may also be patterned to define further source drain contacts and a gate contact. The patterning may include soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing.

Figure 16:
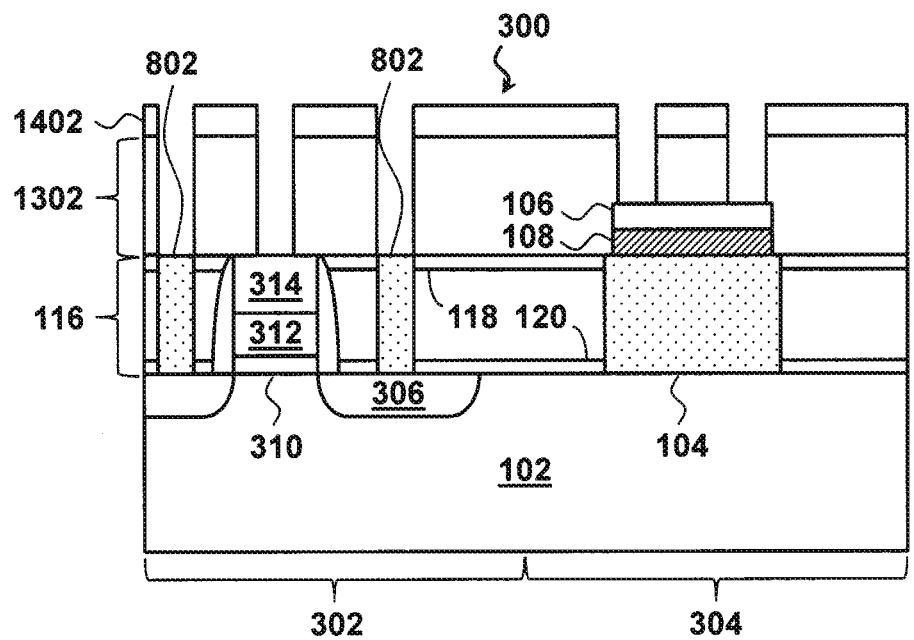

Referring to block 224 of FIG. 2 and to FIG. 16, the second ILD 1302 is etched to transfer the pattern of the second photoresist coating 1402. Accordingly, the second ILD 1302 may be etched to further define the contacts coupled to the top plate 106 and the bottom plate 104, and to expose the source/drain contacts 802 and the gate electrode 314. Etching the second ILD 1302 may include multiple etching steps, particularly in embodiments in which the second ILD 1302 contains multiple layers. The second photoresist coating 1402 may be stripped following the etching of block 224.

Figure 17:
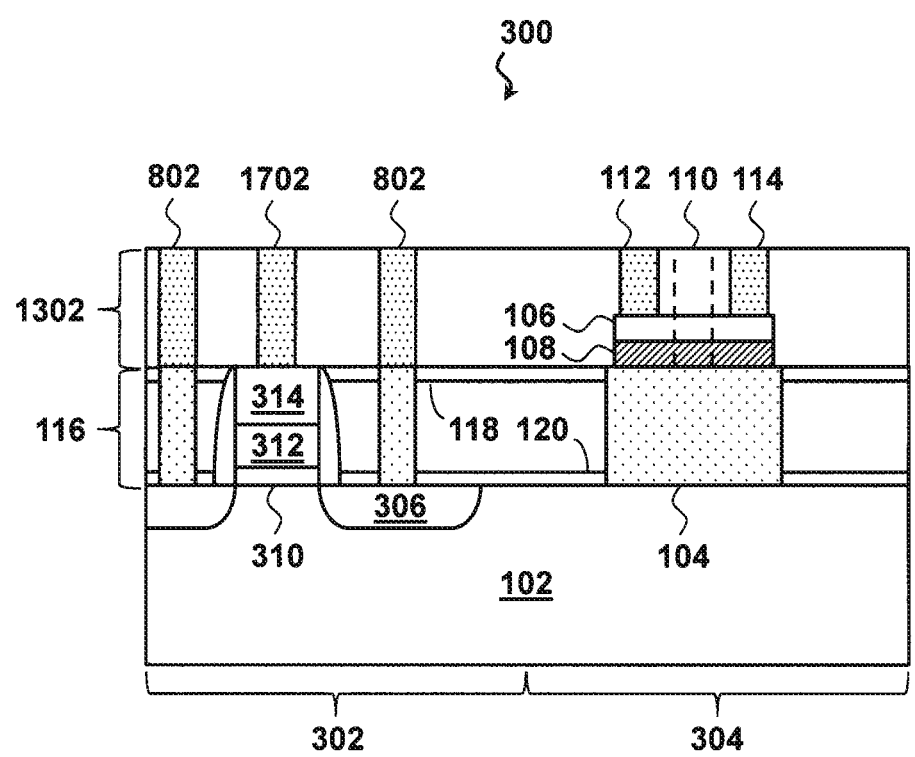

Referring to block 226 of FIG. 2 and to FIG. 17, a metallization process is performed on the substrate 102. The metallization process forms a first contact 112, a second contact 114, and a bottom-plate contact 110 (indicated by a broken line, as it is not in the cross-sectional plane in the illustrated embodiment), each substantially similar to those of FIGS. 1A, 1B, and 1C. The metallization process of block 226 may also form a gate contact 1702 and extend the source/drain contacts 802. Metallization refers to the deposition of any suitable conductive material, whether the material is technically a metal or not. In an exemplary embodiment, the metallization process deposits copper via a CVD process. In further embodiments, the process deposits tungsten, aluminum, aluminum/silicon/copper alloy, titanium, titanium nitride, tungsten, tungsten nitride, metal silicide, non-metallic conductive material, and/or combinations thereof. The metallization process of block 226 may also include a chemical mechanical polish (CMP) process.

Thus, the present disclosure provides a passive integrated circuit device incorporating both a resistor and a capacitor and a method of forming the circuit device. In some embodiments, an integrated circuit device is provided. The integrated circuit device comprises a substrate and a passive device disposed on the substrate. The passive device includes: a bottom plate disposed over the substrate; a top plate disposed over the bottom plate; a spacing dielectric disposed between the bottom plate and the top plate; a first contact and a second contact electrically coupled to the top plate; and a third contact electrically coupled to the bottom plate; wherein the passive device is configured to provide a target capacitance and a target resistance. In one such embodiment, the top plate is a first top plate, the target resistance is a first target resistance, the passive device further includes a second top plate disposed over the bottom plate, the second top plate is configured to provide a second target resistance, and the second target resistance is different from the first target resistance.

In further embodiments, an integrated circuit is provided comprising a substrate, an active device disposed on the substrate, and a passive device disposed over the substrate. The passive device includes: a bottom plate disposed over the substrate; a spacer disposed over the bottom plate; and a top plate disposed over the spacer. The passive device is configured to provide a predetermined resistance between a first contact electrically coupled to the top plate and a second contact electrically coupled to the top plate, and the passive device is further configured to provide a predetermined capacitance between the top plate and the bottom plate.

In some embodiments, a method includes receiving a substrate that has undergone front end of line (FEOL) processing; and performing back end of line (BEOL) processing on the substrate, wherein a capacitor structure is formed over the substrate during the BEOL processing, the capacitor structure incorporating a resistor with a capacitor. The BEOL processing can include performing a first metallization process to form a bottom plate of the capacitor structure; forming a dielectric spacer of the capacitor structure over the bottom plate; forming a top plate of the capacitor structure over the dielectric spacer; and performing a second metallization process to form contacts coupled to the top plate and the bottom plate of the capacitor structure. The method can further include configuring the top plate and the bottom plate to produce a target capacitance for the capacitor, and configuring the top plate to produce a target resistance. In some embodiments, the top plate is formed after removing a dummy gate from an active device. In some embodiments, the first metallization process further forms source/drain contacts coupled to source/drain regions of an active device. In some embodiments, the second metallization process further forms a first contact and a second contact coupled to the top plate and a gate contact coupled to a gate of an active device. Forming the dielectric spacer and the forming the top plate can include forming a dielectric spacer material layer over the substrate; forming a top plate material layer over the dielectric spacer material layer; and patterning and etching the dielectric spacer material layer and the top plate material layer to form the dielectric spacer and the top plate. In some embodiments, the top plate material layer includes a ceramic material layer. In some embodiments, the top plate material layer includes a polysilicon material layer.

In other embodiments, a method for fabricating a passive device includes forming a first interlevel dielectric (ILD) layer over a substrate; forming a bottom plate in the first ILD layer; forming a dielectric spacer layer over the first ILD layer; forming a top spacer layer over the dielectric spacer layer; patterning and etching the dielectric spacer layer and the top spacer layer to form a dielectric spacer and a top plate over the bottom plate, wherein the bottom plate, dielectric spacer, and top plate are configured to form the passive device; forming a second ILD layer over the first ILD layer; and forming a first contact, a second contact, and a third contact extending through the second ILD layer, such that the first contact and the second contact are coupled to the top plate and the third contact is coupled to the bottom plate. In some embodiments, the method further includes configuring materials and dimensions of the top plate and the bottom plate to produce a target capacitance for the capacitor; and configuring materials and dimensions of the top plate to produce a target resistance.

The method can further include forming source/drain contacts that extend through the first ILD layer when forming the bottom plate, wherein the source/drain contacts are coupled to source/drain regions of an active device. In some embodiments, the method further includes extending the source/drain contacts through the second ILD layer when forming the first contact, the second contact, and the third contact. The method can further include forming a transistor over the substrate before forming the first ILD layer. In some embodiments, forming the bottom plate in the first ILD layer includes forming a patterned photoresist layer over the first ILD layer; etching the first ILD layer using the patterned photoresist layer, such that a bottom plate region is defined in the first ILD layer; and depositing a conductive material in the bottom plate region. In some embodiments, forming the first contact, the second contact, and the third contact extending through the second ILD layer includes forming a patterned photoresist layer over the second ILD layer; etching the second ILD layer using the patterned photoresist layer, such that a first contact region, a second contact region, and a third contact region are defined in the second ILD layer; and depositing a conductive material in the first contact region, the second contact region, and the third contact region.

In yet further embodiments, a method of forming an integrated circuit device is provided. The method comprises: receiving a substrate having an active device region and a passive device region, the active device region having a metal gate electrode formed thereupon; forming a first ILD above the substrate; performing a first metallization procedure to form a bottom plate disposed within the first ILD;

forming a dielectric spacer above the bottom plate; forming a top plate above the dielectric spacer; and performing a second metallization procedure to form a first contact and a second contact electrically coupled to the top plate and a third contact electrically coupled to the bottom plate. In one such embodiment, the performing of the first metallization procedure, the forming of the dielectric spacer, the forming of the top plate, and the performing of the second metallization procedure are back end of line (BEOL) processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a substrate that has undergone front end of line (FEOL) processing, wherein an active device is formed over the substrate during the FEOL processing; and
performing back end of line (BEOL) processing on the substrate, wherein a capacitor structure is formed over the substrate during the BEOL processing, the capacitor structure incorporating a resistor with a capacitor, wherein the performing the BEOL processing includes:
performing a first metallization process to form a bottom plate of the capacitor structure and source/drain contacts coupled to source/drain regions of the active device,
forming a dielectric spacer of the capacitor structure over the bottom plate,
forming a top plate of the capacitor structure over the dielectric spacer, and
performing a second metallization process to form contacts coupled to the top plate and the bottom plate of the capacitor structure.

2. The method of claim 1, wherein the contacts include a first contact and a second contact coupled to the top plate, and the second metallization process further forms a gate contact coupled to a gate of the active device.

3. The method of claim 1, wherein the forming the dielectric spacer and the forming the top plate includes:
forming a dielectric spacer material layer over the substrate;
forming a top plate material layer over the dielectric spacer material layer; and
patterning and etching the dielectric spacer material layer and the top plate material layer to form the dielectric spacer and the top plate.

4. The method of claim 3, wherein the forming the top plate material layer includes forming a ceramic material layer.

5. The method of claim 3, wherein the forming the top plate material layer includes forming a polysilicon material layer.

6. The method of claim 1, further comprising:
configuring the top plate and the bottom plate to produce a target capacitance for the capacitor; and
configuring the top plate to produce a target resistance.

7. The method of claim 1, wherein the top plate is formed after removing a dummy gate from the active device.

8. A method for fabricating a passive device, the method comprising:
forming a first interlevel dielectric (ILD) layer over a substrate;
forming a bottom plate in the first ILD layer;
forming a dielectric spacer layer over the first ILD layer;
forming a top spacer layer over the dielectric spacer layer;
patterning and etching the dielectric spacer layer and the top spacer layer to form a dielectric spacer and a top plate over the bottom plate, wherein the bottom plate, dielectric spacer, and top plate are configured to form the passive device;
forming a second ILD layer over the first ILD layer; and
forming a first contact, a second contact, and a third contact extending through the second ILD layer, such that the first contact and the second contact are coupled to the top plate and the third contact is coupled to the bottom plate.

9. The method of claim 8, further comprising forming source/drain contacts that extend through the first ILD layer when forming the bottom plate, wherein the source/drain contacts are coupled to source/drain regions of an active device.

10. The method of claim 9, further comprising extending the source/drain contacts through the second ILD layer when forming the first contact, the second contact, and the third contact.

11. The method of claim 8, further comprising forming a transistor over the substrate before forming the first ILD layer.

12. The method of claim 8, wherein the forming the bottom plate in the first ILD layer includes:
forming a patterned photoresist layer over the first ILD layer;
etching the first ILD layer using the patterned photoresist layer, such that a bottom plate region is defined in the first ILD layer; and
depositing a conductive material in the bottom plate region.

13. The method of claim 8, wherein the forming the first contact, the second contact, and the third contact extending through the second ILD layer includes:
forming a patterned photoresist layer over the second ILD layer;
etching the second ILD layer using the patterned photoresist layer, such that a first contact region, a second contact region, and a third contact region are defined in the second ILD layer; and
depositing a conductive material in the first contact region, the second contact region, and the third contact region.

14. The method of claim 8, further comprising:
configuring materials and dimensions of the top plate and the bottom plate to produce a target capacitance for the passive device; and
configuring materials and dimensions of the top plate to produce a target resistance.

15. The method of claim 8, wherein the patterning and etching the dielectric spacer layer and the top spacer layer includes using the same patterned resist layer.

16. A method of forming an integrated circuit device, the method comprising:
receiving a substrate having an active device region and a passive device region, wherein a transistor is disposed in the active device region, the transistor having a gate structure disposed on the substrate;

forming an inter-level dielectric (ILD) layer over the substrate, such that the gate structure is disposed within the ILD layer;

performing a first metallization procedure to form a bottom plate disposed within the ILD layer in the passive device region;

forming a dielectric spacer over the bottom plate;

forming a top plate over the dielectric spacer; and performing a second metallization procedure to form a first contact and a second contact electrically coupled to the top plate and a third contact electrically coupled to the bottom plate.

17. The method of claim 16, wherein the performing of the first metallization procedure, the forming of the dielectric spacer, the forming of the top plate, and the performing of the second metallization procedure are back end of line (BEOL) processes.

18. The method of claim 16, wherein at least one characteristic chosen from a material and a dimension of the top plate and the bottom plate is configured to provide a target capacitance.

19. The method of claim 16, wherein at least one characteristic chosen from a material and a dimension of the top plate is configured to provide a target resistance.

20. The method of claim 16, wherein the forming the dielectric spacer and the forming the top plate includes using the same patterned resist layer as an etch mask.

* * * * *